United States Patent [19]

Fujihira

[11] Patent Number: 5,012,313
[45] Date of Patent: Apr. 30, 1991

[54] INSULATED GATE SEMICONDUCTOR DEVICE

[75] Inventor: Tatsuhiko Fujihira, Kanagawa, Japan

[73] Assignee: Fuji Electric Co., Ltd., Kanagawa, Japan

[21] Appl. No.: 291,463

[22] Filed: Dec. 28, 1988

[30] Foreign Application Priority Data

Dec. 28, 1987 [JP] Japan .................. 62-199984[U]
May 6, 1988 [JP] Japan ................... 63-110105

[51] Int. Cl.$^5$ ............................. H01L 29/78
[52] U.S. Cl. .......................... 357/23.13; 357/13; 357/15; 357/23.4
[58] Field of Search ............... 357/13, 15, 23.4, 23.13

[56] References Cited

U.S. PATENT DOCUMENTS

| | | | |
|---|---|---|---|
| 3,728,591 | 4/1973 | Sunshine | 357/13 |
| 3,964,084 | 6/1976 | Andrews, Jr. et al. | 357/15 |
| 3,987,216 | 10/1976 | Bhatia et al. | 357/15 |
| 4,492,974 | 1/1985 | Yoshida et al. | 357/13 |
| 4,538,167 | 8/1985 | Yoshino et al. | 357/13 |
| 4,583,087 | 4/1986 | van de Venne | 357/13 |
| 4,709,253 | 11/1987 | Walters | 357/13 |
| 4,760,434 | 7/1988 | Tsuzuki et al. | 357/23.4 |
| 4,803,527 | 2/1989 | Hatta et al. | 357/13 |
| 4,831,424 | 5/1989 | Yoshida et al. | 357/13 |

FOREIGN PATENT DOCUMENTS

| | | | |
|---|---|---|---|
| 58-84461 | 5/1983 | Japan | 357/23.13 |
| 58-87873 | 5/1983 | Japan | 357/13 |
| 59-161836 | 9/1984 | Japan | 357/15 |

*Primary Examiner*—Rolf Hille
*Assistant Examiner*—Steven Loke
*Attorney, Agent, or Firm*—Finnegan, Henderson, Farabow, Garrett, and Dunner

[57] ABSTRACT

An insulated gate semiconductor device has a gate protection circuit wherein the breakdown voltage can be arbitrarily selected. In one embodiment, the gate protection circuit includes first polysilicon layer of a first resistance overlaying the gate insulation layer formed on the semiconductor substrate and laterally spaced from the gate layer, and second polysilicon layer of a second resistance higher than the first resistance contacting the first polysilicon layer to form at least one pair of diodes for protecting the gate insulation layer from electrostatic destruction caused by a sudden voltage surge applied to the gate layer. In a second embodiment, the gate protection circuit includes a pair of Schottky barrier diodes consisting of a gate layer and a separation layer overlaying the gate insulation layer together with a layer contacting the gate layer and separation layer.

19 Claims, 2 Drawing Sheets

INSULATED GATE SEMICONDUCTOR DEVICE

BACKGROUND OF THE INVENTION

1. Field of the Invention

The present invention relates to an insulated gate semiconductor device having a gate protection circuit, such as power vertical MOSFETs or insulated gate bipolar transistors (referred to hereinafter as "IGBTs").

2. Description of the Prior Art

In power vertical MOSFET or IGBT semiconductor devices, a p-region is formed in the upper surface of an n-type silicon substrate. An n-type source region is then formed inside the p-region. A gate oxide layer is formed on a portion of the p-region and the n-type substrate surface, and a gate layer is then formed on the gate oxide layer.

The resulting structure forms a channel through the p-region between the n-type source region and the n-type substrate along the gate oxide layer. A major current flows from a source electrode, connected to the source region and p-region, to a drain electrode disposed on the lower surface of the n-type silicon substrate.

The insulated gate semiconductor devices of such structure must be protected from electrostatic destruction caused by a surge in the voltage applied to the gate layer. Particularly, in the field of automotive electronics, it is essential that a gate protection circuit be provided to the device. To satisfy this, a pluarlity of protection diodes connected back to back in series are used.

Japanese Patent Application Laid-Open Publication No. 61-296770 describes a gate protection circuit for insulated gate semiconductor devices in which impurity is introduced into a semiconductor layer of a gate electrode to form an n-p-p-n junction therein, and Zener diodes, which are connected back to back in series are connected across a path formed between source and gate electrodes. Japanese Patent Application Laid-Open Publication No. 58-178566 describes a gate protection circuit in which gate protection diodes are formed by introducing impurity into a specific region in the semiconductor layer.

Similarly, Japanese Patent Application Laid-Open Publication No. 58-88461 and No. 58-87873 describe a gate protection circuit in which gate protection diodes connected back to back in series are formed by introducing impurity into a semiconductor layer, of a polysilicon layer disposed on a semiconductor substrate, for example.

The protection diodes used in prior art gate protection circuits are Zener diodes. These diodes are formed by introducing impurity into the semiconductor layer disposed on a semiconductor substrate or directly into the semiconductor substrate. The breakdown voltage of a Zener diode is 5 V or less. The breakdown voltage required for the gate protection circuit is normally 10 V or more.

To this end, the gate protection circuit constituting Zener diodes comprises a plurality of Zener diodes connected in series in both directions. Further, the breakdown voltage obtained is limited to a multiple of a Zener voltage of a single p-n junction. In such a gate protection circuit, it is very difficult to freely set the breakdown voltage according to the use of the semiconductor device.

SUMMARY OF THE INVENTION

The present invention overcomes the problems and disadvantages of the prior art by providing an insulated gate semiconductor device with a gate protection circuit whose breakdown voltage may easily be selected.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, a first embodiment of the invention involves an insultated gate semiconductor device including a first region of a second conductivity type formed in the upper surface of a semiconductor substrate of a first conductivity type, a source region of the first conductivity type disposed in the upper surface of the substrate and surrounded by the first region, a gate insulating layer overlaying a portion of the first region between the source region and the upper surface of the semiconductor substrate, and a gate layer composed of a polysilicon layer of a first predetermined resistance overlaying the gate insulating layer, in which a channel is formed in the portion of the first region.

The aforesaid semiconductor device is characterized by having at least one pair of diodes, each diode including a first polysilicon layer of the first predetermined resistance, which is made of the same material as the gate layer and overlays the gate insulating layer extending between a region of the semiconductor substrate containing the first region and a gate pad disposed above the gate layer, and a second polysilicon layer of a second predetermined resistance higher than the first predetermined resistance contacting the first polysilicon layer, the conductivity type of the second polysilicon layer being different than that of the first polysilicon layer. The aforesaid pair of diodes are connected back to back in series and disposed between the source region and gate pad, constituting a gate protection circuit.

The first polysilicon layer is formed simultaneously with the gate layer, and the extent of impurity concentration of the second polysilicon layer may be arbitrarily selected to give a desired breakdown voltage for a resultant pair of diodes. The resultant pair of diodes structure provides a high breakdown voltage and allow a back to back connection of the diodes in series with each other.

A second embodiment of the present invention involves an insulated gate semiconductor device having a gate protection circuit comprising a gate layer, a separation layer made of the same material as the gate layer and connected to a source region, and a layer means contacting both the gate and separation layers. The gate layer, separation layer, and layer means overlay a gate insulating layer which overlays the upper surface of a semi-conductor substrate. In the second embodiment, either the gate or layer means is made of a semiconductor material, and the gate, separation and layer means cooperate to form at least one pair of Schottky barrier diodes.

The accompanying drawings, which are incorporated in and constitute a part of this specification, illustrate the aforesaid embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
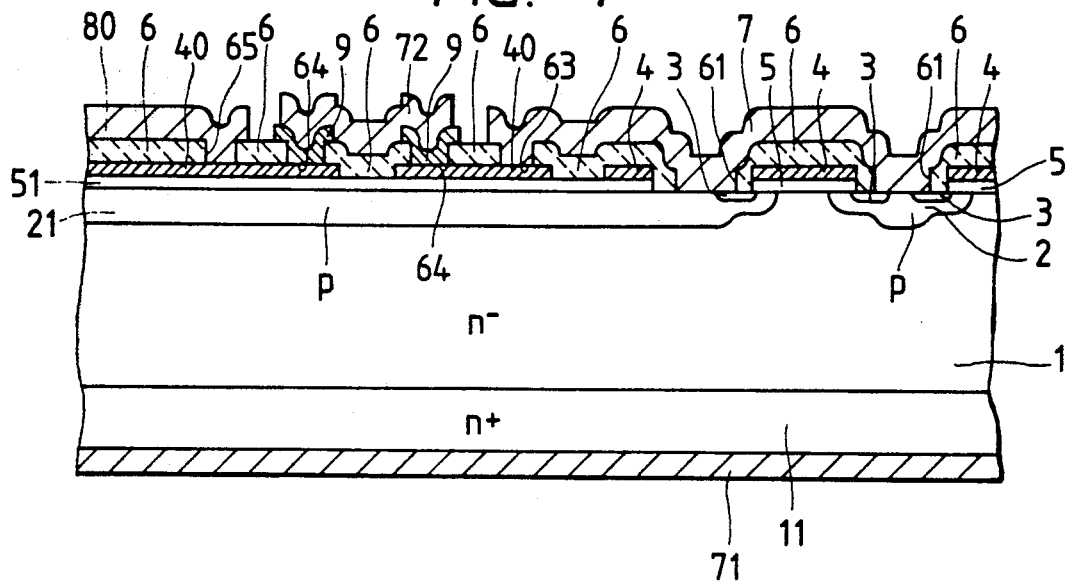
FIG. 1 is a sectional view, taken along line A—A in FIG. 2, of an insulated gate semiconductor device according to a first embodiment of the present invention.
Figure 2:
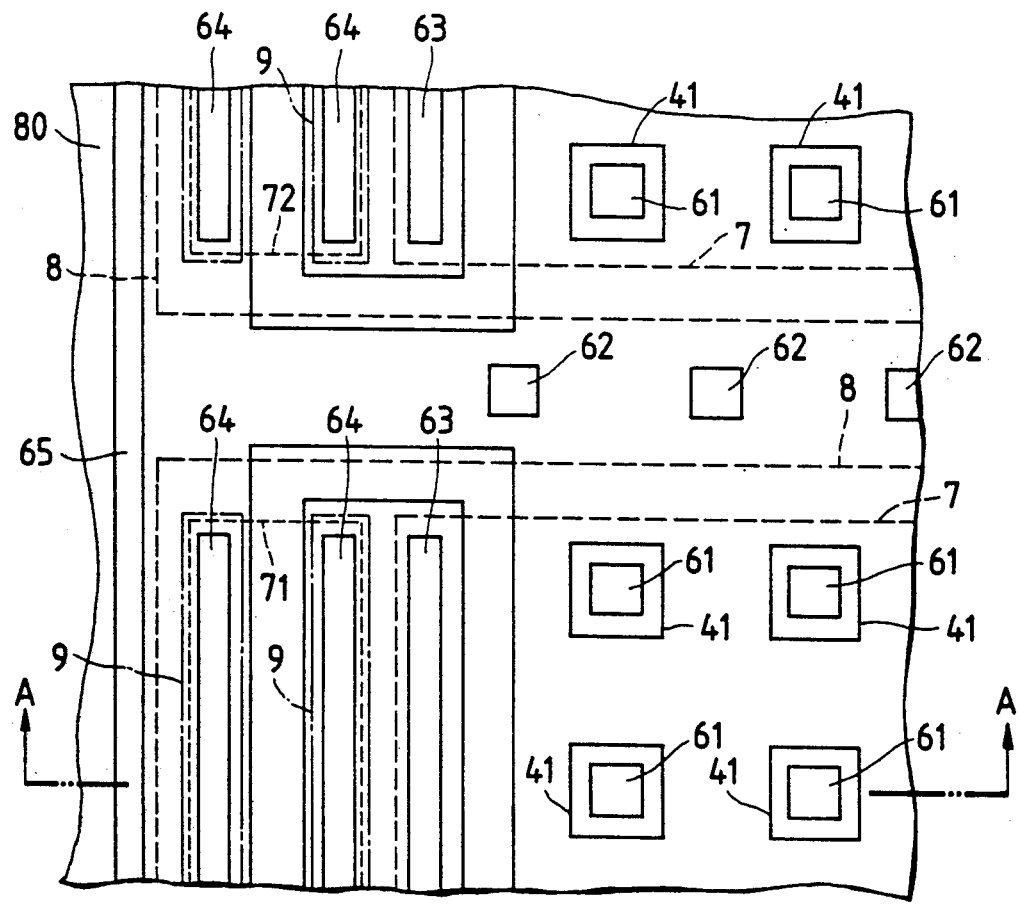
FIG. 2 is a plan view of FIG. 1.
Figure 3:
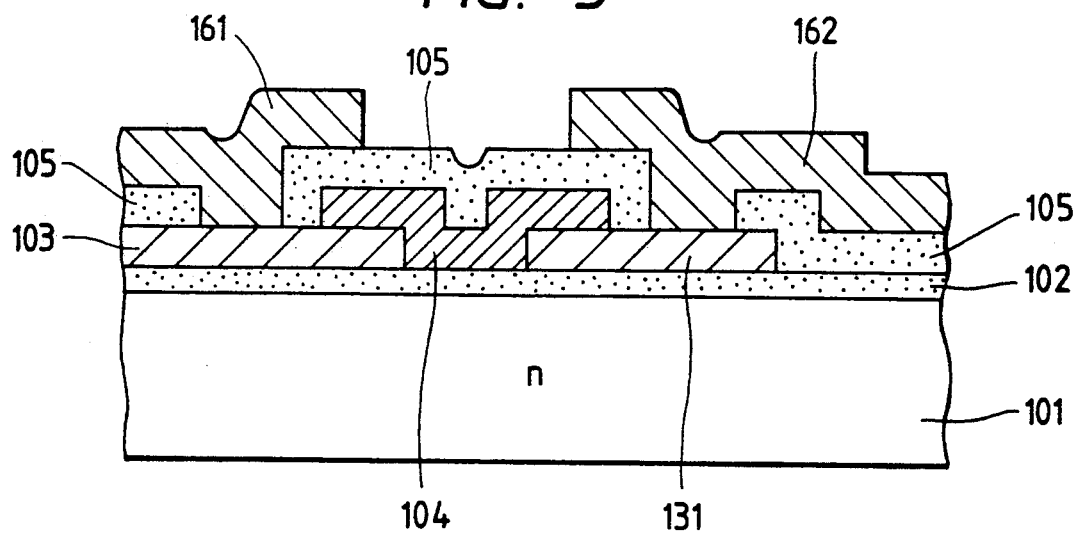
FIG. 3 is a sectional view of an insulated gate semiconductor device according to a second embodiment of the present invention.

FIGS. 1 and 2 refer to a first embodiment of the present invention and FIG. 3 to a second embodiment thereof.

In FIG. 1, a silicon semiconductor substrate constitutes a drain layer comprising an $n^-$ layer 1 and an $n^+$ layer 11. A first region or p-well region 2 is diffused into the upper surface of $n^-$ layer 1. An $n^+$ source region 3 is disposed in the upper surface of $n^-$ layer 1 and surrounded by p-well region 2, and a gate layer 4, constituting an $n^+$ polysilicon layer, is formed on the surface of a gate insulating layer 5. Gate insulating layer 5 is layered on a portion of the p-well region 2, an end portion of the source region 3 and the n-type substrate so that a channel is formed in the p-well region 2 between the $n^-$ layer 1 and the source region 3 under the insulating layer 5 along the gate layer 4.

In FIG. 2, the polysilicon layer of gate layer 4 has windows 41. In each window, an Al or aluminum conductor path contacts $n^+$ source region 3 and p-well region 2 through a contact hole 61 of an insulating layer 6, thereby to form a source electrode 7.

In a vertical MOSFET, the current flowing on a path defined between source electrode 7 and a drain electrode 71, which is in contact with $n^+$ drain layer 11, is controlled by a signal input to gate 4. An extension of the polysilicon layer of gate layer 4 is in contact with an Al conductor path 8 through a contact hole 62 of insulating layer 6 as shown in FIG. 2. The Al conductor path 8 is extended to form a gate bonding pad 80.

An extension 21 of p-well region 2 is disposed below gate pad 80 to improve the breakdown voltage by extending a depletion layer formed between p-well region 2 and $n^-$ layer 1 when a reverse voltage is applied.

A first plurality of spaced polysilicon layers of a first predetermined resistance or $n^+$ type polysilicon layers 40 are simultaneously formed with gate layer 4 above extension 21 of p-well region 2. A gate insulating layer 51 is interlayed between $n^+$ polysilicon layers 40 and extension 21. Each of a second plurality of spaced polysilicon layers of a second predetermined resistance higher than the first predetermined resistance, otherwise referred to as p-type polysilicon layers or p-layers 9, are layered above a respective one of $n^+$ polysilicon layers 40, making contact therewith through contact holdes 64 of insulating film 6, and the resultant gate protection circuit structure constituting a pair of p-n diodes is patterned.

The $n^+$ polysilicon layers 40 and p-layers 9 form two p-n junction diodes, and the p-layers 9 of the two diodes are connected to each other by an aluminium conductor layer 72. One of $n^+$ polysilicon layers 40 of the two p-n junction diodes is connected to an extended portion of a source electrode 7 through a contact hole 63, while the other one to a gate pad 80 through a contact hole 65. With such connections, the two diodes are connected back to back in series between the gate layer and source electrode.

When the gate voltage applied to the path between the gate layer and source region reaches the breakdown voltage of one of the p-n junction diodes, which is determined by the extent of impurity concentration and thickness of p-layers 9, one of the diodes will breakdown according to the polarity of the applied gate voltage, and the breakdown current will flow through the path between the gate layer and source region.

Therefore, a voltage higher than the breakdown voltage of the p-n junction diode will not be applied to that path, and consequently, gate insulating layer 5 may be protected from electrostatic breakdown. The gate protection circuit can be similarly constructed in IGBTs, in which a $p^+$-layer is layered under $n^-$ drain layer 1 instead of the $n^+$ layer 11 shown in FIG. 1.

According to the first embodiment of the present invention, at least one pair of diodes are formed in an insulated gate semiconductor device, each diode constituting a first polysilicon layer of a first predetermined resistance, which is formed simultaneously with and spaced from the gate layer of the device, and a second polysilicon layer of a second predetermined resistance higher than the first predetermined resistance overlaying the first polysilicon layer. The extent of impurity concentration in the p-n junction of the diodes can be arbitrarily selected.

The resultant pair of diodes have a high breakdown voltage, and are connected back to back in series with each other across the path between the gate layer and source region of the semiconductor device. These diodes of a 10 V or higher breakdown voltage can protect the device against electrostatic destruction caused by a sudden voltage surge applied to the gate of the semiconductor device.

Since these diodes are formed in a semiconductor substrate, it is unlikely that parasitic elements can be formed. Consequently, the gate protection circuit of the present invention can be readily implemented in power vertical MOSFETs and IGBTs.

FIG. 3 shows an insulated gate semiconductor device having a gate protection circuit, which is a second embodiment of the present invention.

In the second embodiment, a thermal oxide film 102 serving as a gate insulating layer is formed over an n-type semiconductor substrate 101. An n-type polysilicon layer is deposited over thermal oxide film 102 by chemical vapor deposition or CVD process, and then photoetched to form a gate layer 103 and a separation region 131, spaced from one another.

Subsequently, a first region or a p-well region, a part of which is to serve as a channel, is formed in the upper surface of the semiconductor substrate (not shown) by thermal diffusion process, for example, and an n-type source region (not shown) is subsequently formed in the upper surface of the substrate and surrounded by the p-well region. In this structure, an extension of a gate electrode on the channel becomes gate layer 103.

Then a metal such as Molybdenum(Mo), which forms a Schottky barrier at the metal-semiconductor junction, is deposited to form a metal layer by a sputtering process over the n-type polysilicon gate layer 103 and separation region 131. The metal layer is then photoetched to from Schottky barrier metal layer 104 which contacts with the gate layer 103 and the separation layer 131. The resultant structure is then covered with an insulating layer 105 made of insulating material such as phosphorous glass (PGS). A gate terminal 161, which contacts gate layer 103 through a respective opening of insulating layer 105, and a source terminal 162, which contacts separation region 131 through an opening of the insulating layer 105 and is connected to a source electrode of the source region through a respective opening, are formed by a conventional manufacturing process of a semiconductor device. The gate and source terminals are made of Al or aluminum.

In FIG. 3, gate layer 103 and separation layer 131, both being made of n-type polysilicon materials, and schottky barrier metal layer 104 which contacts gate layer 103 and separation layer 131 to form Schottky barriers functionally constitute a pair of Schottky barrier diodes. These diodes are connected back to back in series and are connected between gate and source terminals 161 and 162, thus forming a gate protection circuit.

The breakdown voltage of the gate protection circuit may be changed by selecting metal for the Schottky barrier metal layer 104 from among those having respectively different Schottky barrier potential against n-type silicon materials such as Mo or gold (Au). If Molybdenum silicide, or silicide of any other metal having a high melting point is used for gate layer 103 and separation layer 131, and n-type polysilicon, for example, for the layer contacting gate layer 103 and separation layer 131 instead of Schottky barrier metal layer 104, a gate protection circuit will be formed containing a pair of Schottky barrier diodes connected back to back in series the forward bias direction of the diodes being opposite to that in the aforesaid original arrangement.

In this embodiment, the breakdown voltage of the gate protection circuit is arbitrarily set by effecting the extent of impurity concentration of the n-type polysilicon of the layer substituted for Schottky barrier metal layer 104.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Figure 4:
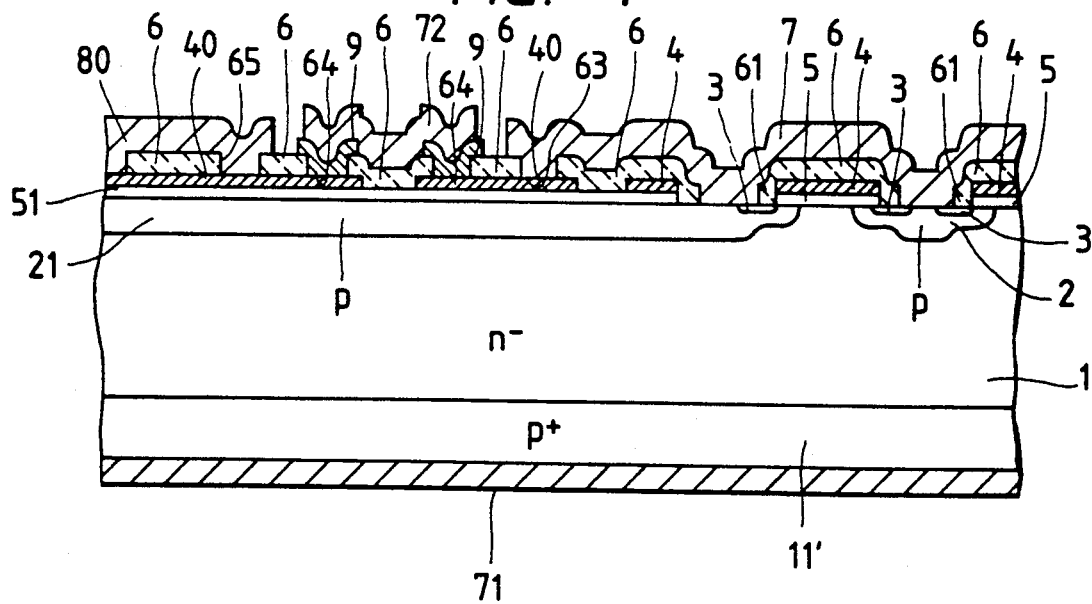
FIG. 4 is a sectional view of an insulated gate bipolar transistor according to a first embodiment.

Although the above-mentioned description is related to a MOSFET, the present invention may be applied to an insulated gate bipolar transistor as shown in FIG. 4, in which the structure is the same as that shown in FIG. 1 except that a p+ layer 11' instead of an n+ layer is formed.

What is claimed is:

1. An insulated gate semiconductor device having a gate protection circuit comprising:
    a substrate of a first conductivity type having upper and lower surfaces;
    a first region of a second conductivity type formed in the upper surface of the substrate;
    a source region of the first conductivity type formed in the upper surface of the substrate and surround by said first
    a gate insulating layer overlying an end portion of said source region, a portion of said first region adjoining said source region and said upper surface of said substrate adjoining said portion;
    a gate layer overlying said gate insulating layer, a channel being formed in said portion of said first region;
    first layer means overlying the gate insulation layer and being laterally spaced from the gate layer, said first layer means having a first plurality of spaced polysilicon layers with a first predetermined resistance;
    second layer means having a second plurality of spaced polysilicon layers with a second predetermined resistance higher than said first predetermined resistance, each one of the second plurality of polysilicon layers overlying a respective one of the first plurality of polysilicon layers to form a corresponding pair of diodes therewith; and
    means for connecting the pair of diodes back to back in series for protecting the gate insulating layer from electrostatic destruction caused by a sudden voltage surge supplied to the gate layer.

2. An insulated gate semiconductor device of claim 1, wherein said connecting means is a conductor layer.

3. An insulated gate semiconductor of claim 1, wherein
    the conductivity types of the first and second pluralities of spaced polysilicon layers are different from each other.

4. An insulated gate semiconductor of claim 1, wherein the material of the first plurality of spaced polysilicon layers and the material of the gate layer are identical to each other.

5. An insulated gate semiconductor of claim 4, wherein, the first plurality of spaced polysilicon layers and the gate layer are formed simultaneously.

6. An insulated gate semiconductor of claim 1, further comprising a source electrode coupled to said first region source region and first layer means; and a gate bonding pad coupled to said first layer means and said gate layer.

7. An insulated gate semiconductor device having a gate protection circuit, comprising:
    a substrate of a first conductivity type having upper and lower surfaces;
    a first region of a second conductivity type formed in the upper surface of the substrate;
    a source region of the first conductivity type formed in the upper surface of the substrate and surrounded by said first region;
    a gate insulating layer overlaying an end portion of said source region, a portion of said first region adjoining said source region and said upper surface of said substrate adjoining said portion;
    a gate layer overlaying said gate insulating layer, a channel being formed in said portion of said first region;
    a separation layer overlaying the gate insulating layer and spaced from the gate layer; and
    barrier layer means coupling an extended portion of said gate layer and said separation layer to form at least one pair of Schottky barrier diodes for protecting the gate insulating layer from electrostatic destruction caused by a sudden voltage surge applied to the gate layer.

8. An insulated gate semiconductor device of claim 7, wherein said gate layer, separation layer, and barrier layer means are formed on the gate insulating layer.

9. An insulated gate semiconductor device of claim 7, wherein the material of said gate layer and the material of separation layer are identical to each other.

10. An insulated gate semiconductor device of claim 7, wherein said gate and separation layers are simultaneously formed.

11. An insulated gate semiconductor device of claim 7, wherein any one of said gate and separation layers and said barrier layer means is composed of a semiconductor material.

12. An insulated gate semiconductor device of claim 7, wherein the material of said barrier layer means is composed of a metal having a Shottky barrier potential against n-type silicon materials.

13. An insulated gate semiconductor device of claim 12, wherein said metal is Molybdenum.

14. An insulated gate semiconductor device of claim 12, wherein said metal is gold.

15. An insulated gate semiconductor device of claim 7, wherein the material of said gate layer composed of a metal having a melting point approximating that of Molybdenum silicide.

16. An insulated gate semiconductor device of claim 15, wherein said metal is Molybdenum silicide.

17. An insulated gate semiconductor device of claim 15, wherein said metal is silicide.

18. An insulated gate semiconductor device of claim 7, wherein the material of said barrier layer means is n-type polysilicon.

19. An insulated gate semiconductor device of claim 1 or claim 8, further comprising a layer of the first conductivity type overlying said lower surface of said substrate of said first conductivity type; and a drain electrode overlying said layer of the first conductivity type.

* * * * *

UNITED STATES PATENT AND TRADEMARK OFFICE
CERTIFICATE OF CORRECTION

PATENT NO. : 5,012,313
DATED : April 30, 1991
INVENTOR(S) : Tatsuhiko Fujihira

It is certified that error appears in the above-identified patent and that said Letters Patent is hereby corrected as shown below:

Claim 1, Column 6, Line 3, after "first" insert --region;--;

Claim 6, Column 6, Line 42-43, after "region" insert -- , --;

Claim 19, Column 8, Line 17, change "8" to --7--;

Column 6, line 2, "surround" should read --surrounded--.

Signed and Sealed this

Thirtieth Day of November, 1993

Attest:

BRUCE LEHMAN

Attesting Officer

Commissioner of Patents and Trademarks